(12) United States Patent
Nakai

(10) Patent No.: US 8,401,738 B2
(45) Date of Patent: Mar. 19, 2013

(54) ELECTRIC POWER STEERING SYSTEM

(75) Inventor: Tomoya Nakai, Toyota (JP)

(73) Assignee: Jtekt Corporation, Osaka (JP)

( * ) Notice: Subject to any disclaimer, the term of this patent is extended or adjusted under 35 U.S.C. 154(b) by 262 days.

(21) Appl. No.: 12/885,780

(22) Filed: Sep. 20, 2010

(65) Prior Publication Data

US 2011/0071730 A1 Mar. 24, 2011

(30) Foreign Application Priority Data

Sep. 24, 2009 (JP) ................................ 2009-218799

(51) Int. Cl.
*B60L 1/00* (2006.01)
*G06F 7/00* (2006.01)
*G06F 17/00* (2006.01)
(52) U.S. Cl. ............ 701/42; 701/41; 307/10.1; 318/293
(58) Field of Classification Search .................. 701/41, 701/42
See application file for complete search history.

(56) References Cited

U.S. PATENT DOCUMENTS

| | | | | |
|---|---|---|---|---|
| 5,804,973 A * | 9/1998 | Shinohara et al. | ............ | 324/548 |
| 6,577,024 B2 * | 6/2003 | Kikuta et al. | ................ | 307/10.1 |
| 7,196,895 B2 * | 3/2007 | Ito et al. | ......................... | 361/160 |
| 2002/0057015 A1 | 5/2002 | Kikuta et al. | | |
| 2011/0066331 A1 * | 3/2011 | Yamashita | ...................... | 701/42 |

FOREIGN PATENT DOCUMENTS

| GB | 2 392 990 A | 3/2004 |
|---|---|---|
| JP | A-2007-276706 | 10/2007 |

OTHER PUBLICATIONS

Jul. 22, 2011 Extended European Search Report issued in European Patent Application No. EP 10 17 8776.

* cited by examiner

*Primary Examiner* — Thomas Tarcza
*Assistant Examiner* — Tyler J Lee
(74) *Attorney, Agent, or Firm* — Oliff & Berridge, PLC

(57) ABSTRACT

An ECU of an electric power steering system includes a driving circuit configured as an H bridge circuit; a microcomputer that controls the driving circuit; a capacitor for stabilizing electric power that is supplied to the driving circuit; and a resistor that is interposed in a second power supply path that bypasses a first power supply path in which the relay contact is interposed. The microcomputer causes a relay circuit to be activated after the capacitor is charged via the resistor (second power supply path). The microcomputer determines whether a stuck-open fault has occurred on the basis of a voltage difference between terminals of the relay contact at the time when both FETs that are connected in series and that constitute the driving circuit are turned on to cause the discharge of the capacitor after the relay circuit is activated.

8 Claims, 5 Drawing Sheets

ABSTRACT

ELECTRIC POWER STEERING SYSTEM

INCORPORATION BY REFERENCE

The disclosure of Japanese Patent Application No. 2009-218799 filed on Sep. 24, 2009 including the specification, drawings and abstract, is incorporated herein by reference in its entirety.

BACKGROUND OF THE INVENTION

1. Field of the Invention

The invention relates to an electric power steering system.

2. Description of the Related Art

There is an electric power steering system (EPS) that uses a motor as a driving source. The electric power steering system includes a driving circuit that supplies a driving current to the motor on the basis of a power supply voltage, a control device that controls the operation of the driving circuit and a relay circuit that turns on or off a relay contact provided in a first power supply path that connects the driving circuit and a power supply to each other.

Normally, a capacitor is provided between the relay contact and the driving circuit in order to stabilize the supply of power from the power source. However, in a state where such a capacitor is provided, when the charge amount of the capacitor is small at the time when the relay contact enters an on state, an inrush current may flow from the power supply to the relay contact.

Then, for example, as described in Japanese Patent Application Publication No. 2007-276706 (JP-A-2007-276706), the EPS includes a precharge circuit that is interposed in a second power supply path that bypasses the relay contact in order to prevent occurrence of the inrush current. Then, an ignition switch is turned on, the capacitor is charged (precharged) by the precharge circuit, and then the relay contact is turned on.

In such an EPS, stuck-open fault, in which the relay contact remains turned off, may occur, for example, when foreign matter is caught in the relay contact. Then, there is known an EPS that includes the precharge circuit provided with a switching element and a discharge circuit. The switching element is used for switching between the execution and termination of precharge. The discharge circuit has a circuit configuration similar to that of the precharge circuit, and is provided between the capacitor and the driving circuit. In the EPS, after the relay circuit is activated in order to turn on the relay contact, the precharge is stopped, and a voltage difference between both terminals of the relay contact is detected in a state where the capacitor is discharged to thereby determine whether the relay contact has a stuck-open fault.

When the relay contact is normal and has no stuck-open fault, the relay circuit is activated and then the relay contact is actually turned on. Therefore, even when the capacitor is discharged in a state where precharge is stopped, the capacitor-side terminal voltage of the relay contact does not decrease but is kept at the power supply voltage. On the other hand, when the relay contact has a stuck-open fault, the relay contact is not actually turned on even when the relay circuit is activated. Therefore, when the capacitor is discharged in a state where precharge is stopped, the capacitor-side voltage of the relay contact decreases. Thus, when there is a voltage difference between both terminals of the relay contact after the capacitor is discharged in a state where precharge is stopped, it is determined that the relay contact has a stuck-open fault.

However, in the existing configuration, in order to detect the above-described stuck-open fault, the precharge circuit need to have a function of switching between the execution and termination of the precharge. Furthermore, it is necessary to provide a discharge circuit having a scale similar to that of the above-described precharge circuit between the capacitor and the driving circuit. As a result, the number of components of the control device increases.

SUMMARY OF INVENTION

It is an object of the invention to provide an electric power steering system that is able to detect a stuck-open fault of a relay contact with a simple configuration.

An aspect of the invention relates to an electric power steering system that includes: a motor that applies assist force for assisting steering operation to a steering system; a driving circuit that supplies a driving current to the motor on the basis of a power supply voltage, and that is formed by connecting switching arms, each of which is formed of a pair of switching elements connected in series, in parallel with each other; a controller that controls operation of the driving circuit; a relay circuit that turns on or off a relay contact provided in a first power supply path that connects the driving circuit and a power supply to each other; and a fault detector that detects a fault of the relay contact. A capacitor is interposed between the relay contact and the driving circuit. The relay circuit is activated after the capacitor is charged through a second power supply path that bypasses the relay contact when an ignition switch is turned on. The fault detector determines whether the relay contact has a stuck-open fault, in which the relay contact remains turned off, on the basis of a voltage difference between both terminals of the relay contact after the relay circuit is activated. A resistor is interposed in the second power supply path. The controller turns on both of the switching elements that constitute one of the switching arms when whether the relay contact has the stuck-open fault is determined.

With the above configuration, in a state where the relay contact is turned off, the capacitor-side terminal of the relay contact is connected to a power supply via only the second power supply path in which the resistor is provided. Thus, when the capacitor is discharged via the switching arm in that state, the terminal voltage decreases with a voltage drop caused by the resistor, and then a voltage difference occurs between both terminals of the relay contact. On the other hand, in a state where the relay contact is turned on, the capacitor-side terminal of the relay contact is connected to the power supply via the first power supply path in which no resistor is provided. Therefore, even when the capacitor is discharged via the switching arm in that state, a voltage difference does not occur between both terminals of the relay contact. That is, when the relay contact has no stuck-open fault after the relay circuit is activated in order to turn on the relay contact, no voltage difference occurs between both terminals of the relay contact even when the capacitor is discharged. Therefore, if the relay contact has a stuck-open fault, a voltage difference occurs when the capacitor is discharged. Thus, the fault detector determines that the relay contact has a stuck-open fault if a voltage difference occurs between the both terminals of the relay contact when both switching elements that constitute one of the switching arms are turned on after the relay circuit is activated. Note that, when the capacitor is discharged via only one of the switching arms, no driving current is supplied to the motor when the capacitor is discharged. Therefore, no unintentional assist force is applied to the steering system.

In the above configuration, when the capacitor is discharged in a state where the capacitor is precharged via the resistor, it is determined whether a stuck-open fault has occurred on the basis of the voltage difference that occurs between both terminals of the relay contact. Therefore, the precharge circuit is not required to have a function of switching between the execution and termination of the precharge, unlike the existing art. In addition, the capacitor is discharged by turning on both the pair of switching elements that constitute one of the switching arms of the driving circuit. Therefore, the discharge circuit is no longer required.

BRIEF DESCRIPTION OF DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
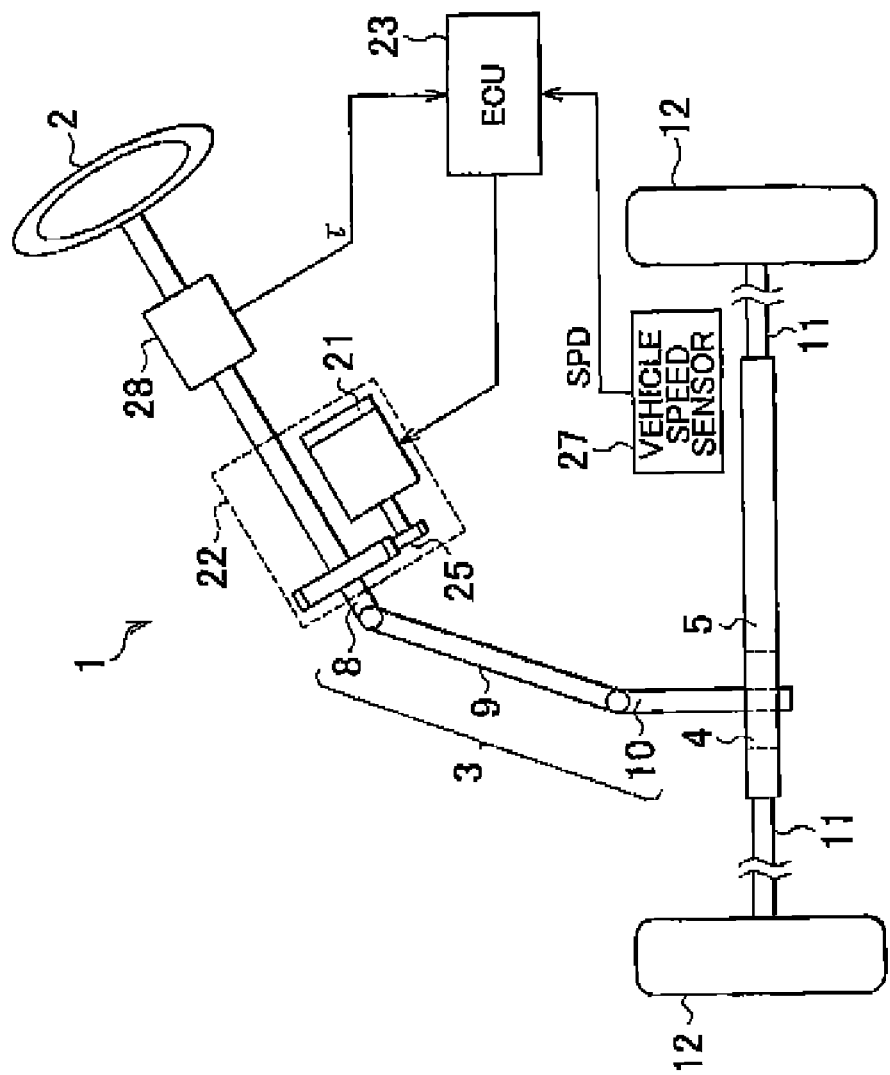
FIG. 1 is a schematic configuration diagram of an electric power steering system (EPS)

Hereinafter, an embodiment of the invention will be described with reference to the accompanying drawings. As shown in FIG. 1, an electric power steering system (EPS) 1 includes a steering shaft 3 to which a steering wheel 2 is fixed. The steering shaft 3 is coupled to a rack shaft 5 via a rack-and-pinion mechanism 4. The rotation of the steering shaft 3 resulting from steering operation is converted into linear reciprocating motion of the rack shaft 5 by the rack-and-pinion mechanism 4. Note that the steering shaft 3 is formed by coupling a column shaft 8, an intermediate shaft 9 and a pinion shaft 10 to each other. Then, the linear reciprocating motion of the rack shaft 5 resulting from the rotation of the steering shaft 3 is transmitted to knuckles (not shown) via tie rods 11 coupled to respective ends of the rack shaft 5. This changes the steered angles of steered wheels 12, that is, the traveling direction of a vehicle.

The EPS 1 includes an EPS actuator 22 and an ECU 23. The EPS actuator 22 applies assist force for assisting steering operation to a steering system using a motor 21 as a driving source. The ECU 23 controls the operation of the EPS actuator 22.

The EPS actuator 22 is a column assist-type EPS actuator. The motor 21 that serves as the driving source of the EPS actuator 22 is drivably coupled to the column shaft 8 via a reduction mechanism 25. Note that a brush direct-current motor is employed as the motor 21. The motor 21 rotates with a driving current supplied from the ECU 23. The speed of rotation of the motor 21 is reduced by the reduction mechanism 25 and the rotation having the reduced speed is transmitted to the column shaft 8 to apply the motor torque to the steering system as assist force.

A vehicle speed sensor 27 and a torque sensor 28 are connected to the ECU 23. The ECU 23 controls the operation of the EPS actuator 22, more specifically, the torque that is generated by the motor 21 that serves as a driving source, on the basis of a vehicle speed SPD and a steering torque τ that are detected by these sensors to thereby execute control over assist force that is applied to the steering system.

Figure 2:
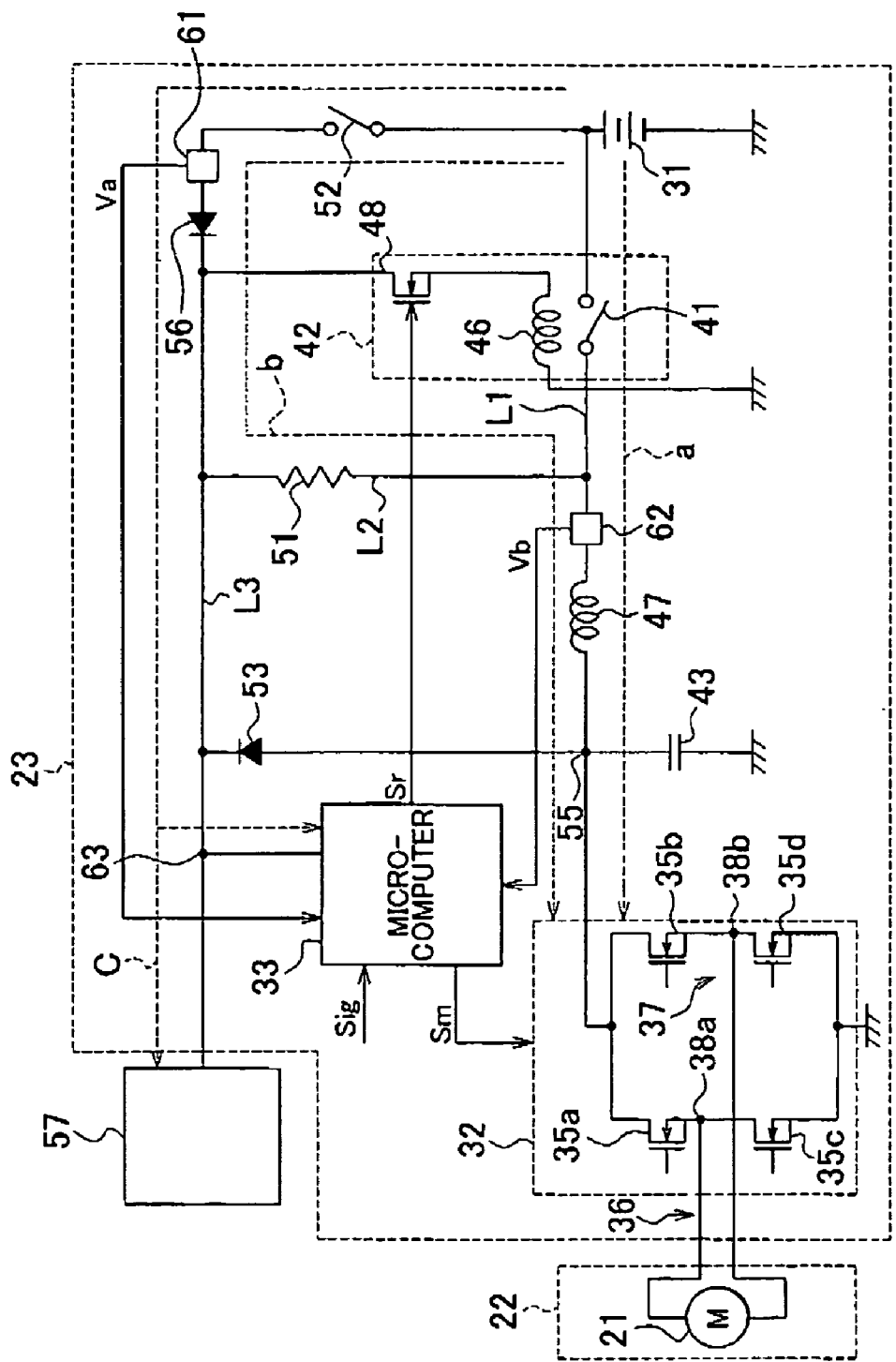
FIG. 2 is a block diagram that shows the electrical configuration of the EPS.

Next, the electrical configuration of the EPS according to the present embodiment will be described. As shown in FIG. 2, the ECU 23 includes a driving circuit 32 and a microcomputer 33. The driving circuit 32 supplies a driving current to the motor 21 on the basis of a voltage of a power supply 31. The microcomputer 33 serves as a controller and an electronic circuit that control the operation of the driving circuit 32 by outputting motor control signals Sm.

The driving circuit 32 is formed by connecting a series circuit formed of a set of FETs (field-effect transistors) 35a and 35c and a series circuit formed of a set of FETs 35b and 35d in parallel with each other. A pair of switching elements connected in series is used as a base unit (switching arm). The driving circuit 32 is configured as a known H bridge circuit that is formed by connecting these two switching arms 36 and 37 in parallel with each other. Then, the motor 21 is connected to a connecting point 38a between the FETs 35a and 35c and a connecting point 38b between the FETs 35b and 35d.

The motor control signals Sm output from the microcomputer 33 are used as gate on/off signals that determine the switching statuses of the FETs 35a to 35d that constitute the driving circuit 32. Then, each of the FETs 35a to 35d is turned on or off in response to the motor control signal Sm applied to its gate terminal, and the electric power of the power supply 31 is output to the motor 21. Note that each motor control signal Sm is a pulse signal that has a duty ratio corresponding to a target assist force, and each of the FETs 35a to 35d is turned on in accordance with the duty ratio.

The ECU 23 includes a relay circuit 42 that turns on or off a relay contact 41 interposed in a first power supply path L1 (path along the wide broken line a in FIG. 2) that connects the driving circuit 32 and the power supply 31 to each other. One end (high-potential terminal) of a capacitor 43 for stabilizing the supply of electric power is connected to the first power supply path L1 at a point between the relay contact 41 and the driving circuit 32. Furthermore, the high-potential terminal of the capacitor 43 is connected to the power supply 31 via a second power supply path L2 (path along the wide broken line b in FIG. 2) that bypasses the relay contact 41 and that connects the driving circuit 32 and the power supply 31 to each other. Note that the other end of the capacitor 43 is grounded.

The relay circuit 42 includes the relay contact 41 and a relay coil 46 that generates electromagnetic force for turning on or off the relay contact 41. One end of the relay contact 41 is connected to the power supply 31, and the other end of the relay contact 41 is connected to the high-potential terminal of the capacitor 43 via a coil 47. The coil 47 functions as a filter for reducing a noise. In addition, a FET 48 is connected to one end of the relay coil 46, and the FET 48 is turned on or off on the basis of a relay control signal Sr output from the microcomputer 33. The relay circuit 42 is activated to turn on the relay contact on the basis of electromagnetic force generated by the relay coil 46 when the FET 48 is turned on or off.

A resistor 51 is interposed in the second power supply path L2. An ignition switch 52 operated at the time of start-up of the vehicle is provided in the second power supply path L2. When the ignition switch 52 is turned on, the capacitor 43 is charged (precharged) with current supplied through the second power supply path L2 in which the resistor 51 is provided in advance of activation of the relay circuit 42.

Note that the other end of the FET 48 connected to the relay coil 46 is connected to the second power supply path L2, and the second power supply path L2 and the first power supply path L1 are connected to each other via a diode (freewheeling diode) 53. Specifically, one end of the diode 53 is connected to the first power supply path L1 at a connecting point 55 at which the capacitor 43 is connected to the first power supply path L1. Then, a diode 56 is provided in the second power supply path L2 in order to prevent backflow of current, which is returned via the diode 53, toward the power supply 31.

In addition, in the ECU 23, a third power supply path L3 (path along the wide broken line c in FIG. 2) that branches from the second power supply path L2 is provided. Then, electric power is supplied through the third power supply path L3 to the microcomputer 33 and another electrical component 57 mounted in the vehicle. That is, the third power supply path L3 is connected to the first power supply path L1 via the resistor 51 of the second power supply path L2.

Next, detection of a fault of the relay contact 41 in the ECU 23 will be described. The ECU 23 has a function of detecting a fault in the relay contact 41 on the basis of a voltage difference between both terminals of the relay contact 41.

The microcomputer 33 activates the relay circuit 42 after completing precharge of the capacitor 43, causes the discharge of the capacitor 43, and then determines whether a fault, in which the relay contact 41 remains turned off (stuck-open fault), has occurred on the basis of a voltage difference between both terminals of the relay contact 41 at that time.

More specifically, the microcomputer 33 receives an IG signal Sig that indicates an on/off state of the ignition switch 52 from an upper level ECU (not shown). Then, the microcomputer 33 activates the relay circuit 42 after a lapse of a predetermined period of time required to complete precharge of the capacitor 43 after the ignition switch 52 is turned on. Thus, it is possible to prevent inrush current from flowing from the power supply 31 to the relay contact 41 when the relay contact 41 is turned on.

In the ECU 23, a voltage sensor 61 is provided between the ignition switch 52 and the diode 56, and a voltage sensor 62 is provided between the capacitor 43-side terminal of the relay contact 41 and the coil 47. These voltage sensors 61 and 62 are connected to the microcomputer 33. The microcomputer 33 uses the voltage detected by the voltage sensor 61, that is, the power supply 31-side terminal voltage Va of the relay contact 41 after the ignition switch 52 is turned on, and the voltage detected by the voltage sensor 62, that is, the capacitor 43-side terminal voltage Vb of the relay contact 41, to detect a voltage difference ΔV between both terminals of the relay contact 41. Thus, the microcomputer 33 and the voltage sensors 61 and 62 constitute a fault detector.

The microcomputer 33 turns on one of the switching arms 36 and 37, for example, the FETs 35a and 35c of the switching arm 36, after the relay circuit 42 is activated to thereby cause the discharge of the capacitor 43. Note that, because the capacitor 43 is discharged only via the switching arm 36, no driving current is supplied to the motor 21 while discharging, and no unintentional assist force is applied to the steering system. Specifically, the microcomputer 33 sets the duty ratio of each motor control signal Sm at or below a predetermined duty ratio (for example, 10%) at which a current flowing from the power supply 31 to the FETs 35a and 35c is prevented from being excessive.

Figure 3A:
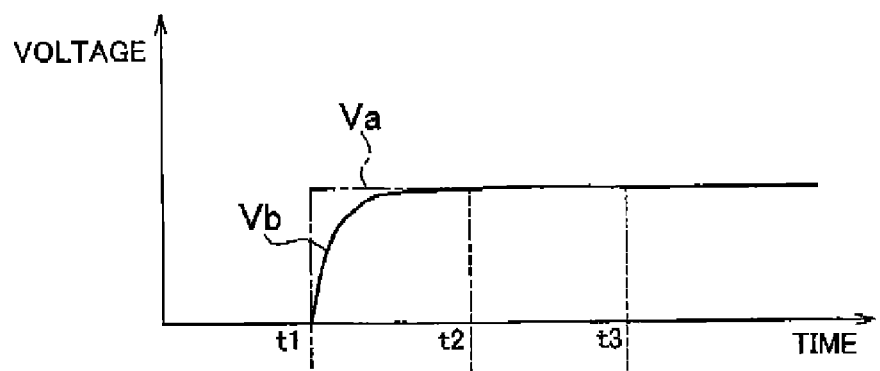
FIG. 3A is a graph that shows a temporal change in voltage between both terminals of a relay contact when the relay contact is normal.

Here, as shown in FIG. 3A, when the relay contact 41 is normal and has no stuck-open fault, if the ignition switch 52 is turned on (time t1), the power supply 31-side terminal voltage Va of the relay contact 41 immediately increases to the power supply voltage, and the capacitor 43-side terminal voltage Vb gradually increases. Then, when precharge of the capacitor 43 is completed and the relay circuit 42 is activated (time t2), the relay contact 41 is turned on, the capacitor 43-side terminal voltage Vb becomes equal to the power supply voltage, and then the voltage difference ΔV becomes "0". In this case, when the capacitor 43 is discharged (after time t3), the capacitor 43-side terminal voltage Vb does not decrease.

Figure 3B:
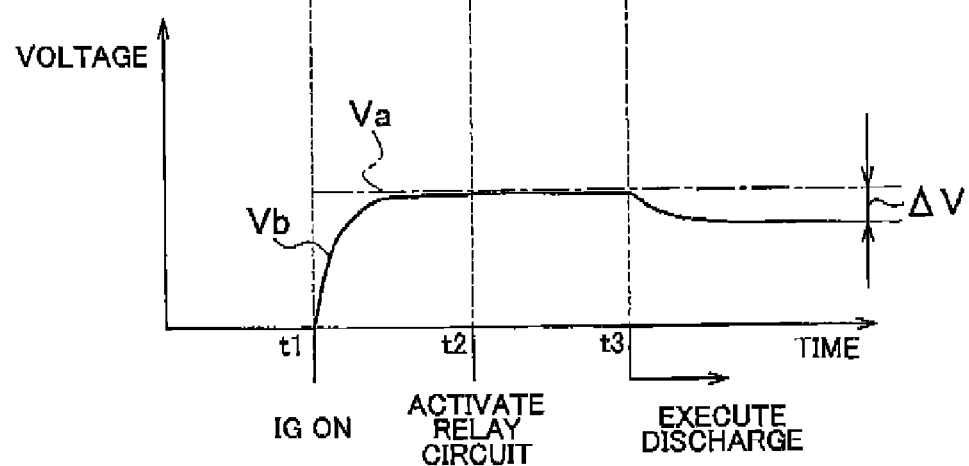
FIG. 3B is a graph that shows a temporal change in voltage between both terminals of the relay contact when the relay contact has a stuck-open fault.

However, as shown in FIG. 3B, when the relay contact 41 has a stuck-open fault, the values of the terminal voltages Va and Vb change in a manner substantially similar to that when the relay contact 41 has no stuck-open fault, until the relay circuit 42 is activated (till time t2). However, when the capacitor 43 is discharged, the capacitor 43-side terminal voltage Vb decreases with a voltage drop caused by the resistor 51.

Focusing on this point, the microcomputer 33 determines that the relay contact 41 has a stuck-open fault when the voltage difference ΔV at the time when the capacitor 43 is discharged via the driving circuit 32 is larger than or equal to a predetermined voltage difference Vth that is used as a threshold. Note that the predetermined voltage difference Vth is a slightly smaller than the voltage value that decreases with a voltage drop caused by the resistor 51. Then, when the stuck-open fault has been detected, power assist control is not executed, and, for example, an alarm lamp (not shown) is lit up to notify a driver of the fault; whereas, when no stuck-open fault has been detected, power assist control is executed.

Figure 4:
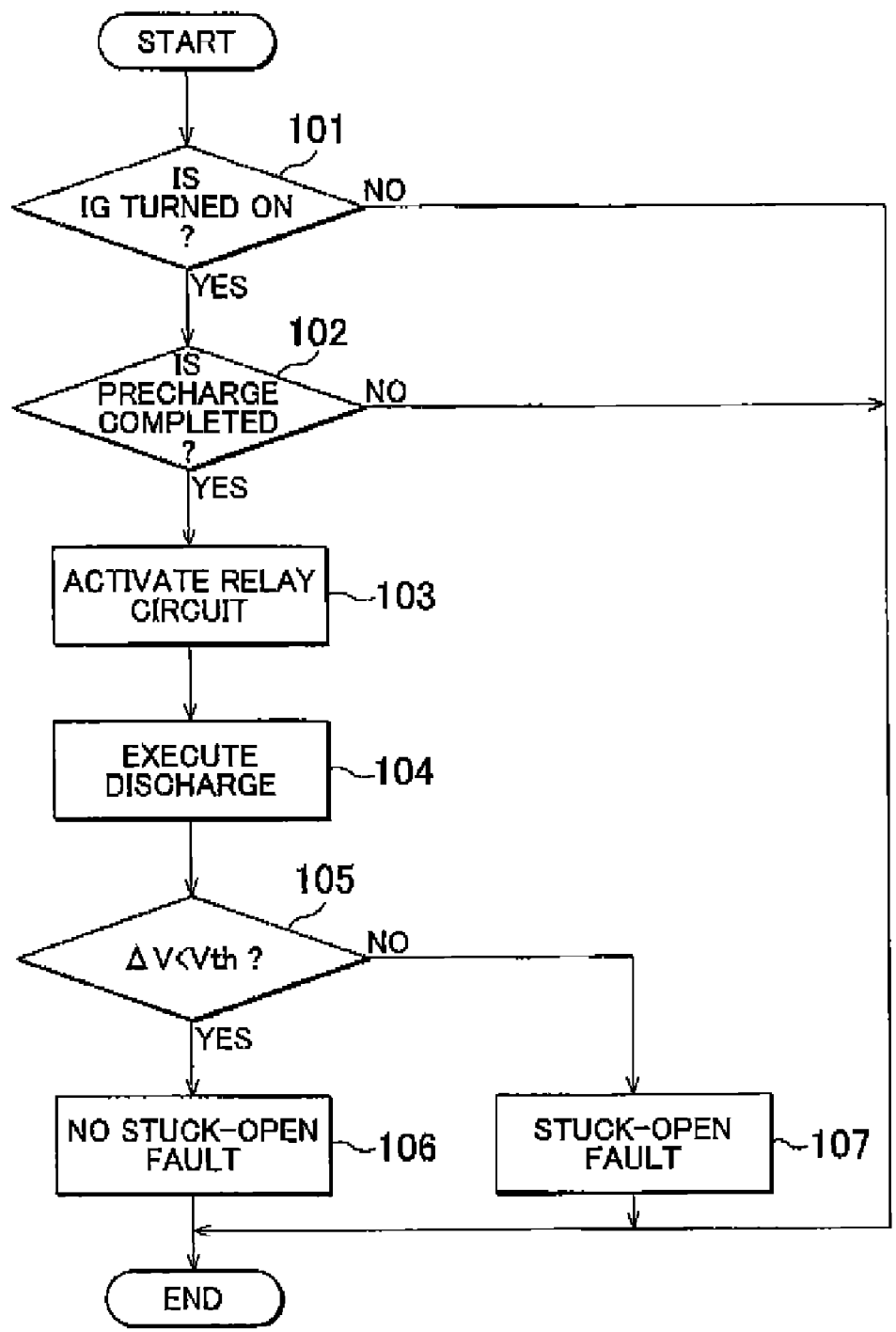
FIG. 4 is a flowchart that shows the procedure of start control.

Next, the procedure of start control executed by the ECU 23 at the time of start-up of the vehicle will be described with reference to the flowchart shown in FIG. 4. As shown in the drawing, when the ignition switch 52 is turned on (step 101: YES) and precharge of the capacitor 43 is completed (step 102: YES), the ECU 23 (microcomputer 33) activates the relay circuit 42 (step 103) and then proceeds to step 104. When the ignition switch 52 is not turned on (step 101: NO), the microcomputer 33 does not execute the process in step 102 and the following steps. When precharge of the capacitor 43 is not completed (step 102: NO), the microcomputer 33 does not execute the process in step 103 and the following steps.

In step 104, the microcomputer 33 outputs the motor control signals Sm for turning on both the FETs 35a and 35c at predetermined duty ratios to the driving circuit 32 to discharge the capacitor 43 (step 104), and then determines whether the voltage difference ΔV between both terminals of the relay contact 41 at that time is smaller than the predetermined voltage difference Vth (step 105). Then, when the voltage difference ΔV is smaller than the predetermined voltage difference Vth (step 105: YES), the microcomputer 33 determines that the relay contact 41 has no stuck-open fault (step 106), and then ends the process. On the other hand, when the voltage difference ΔV is larger than or equal to the predetermined voltage difference Vth (step 105: NO), the microcomputer 33 determines that the relay contact 41 has a stuck-open fault (step 107), and then ends the process.

The microcomputer 33 deactivates the relay circuit 42 in order to turn off the relay contact 41 in a state where the ignition switch 52 is turned off, and then determines whether there is a fault (stuck-closed fault), in which the relay contact 41 is stuck closed and the relay contact 41 remains turned on, on the basis of whether electric power is supplied to the microcomputer 33.

That is, in a state where the ignition switch 52 is turned off and the relay contact 41 is turned off, the first and second power supply paths L1 and L2 are interrupted. Therefore, no driving current is supplied from the power supply 31 to the microcomputer 33. On the other hand, when the relay contact 41 has a stuck-closed fault, even if the ignition switch 52 is turned off, the relay contact 41 remains turned on. In this state, driving current is supplied from the power supply 31 to the microcomputer 33 through the third power supply path L3 that is electrically connected to the first power supply path L1 via the resistor 51 of the second power supply path L2. Specifically, driving current is supplied from the power supply 31 via the relay contact 41, the resistor 51 and the third power supply path L3.

Focusing on this point, the microcomputer 33 deactivates the relay circuit 42 in order to turn off the relay contact 41 in a state where the ignition switch 52 is turned off, and then determines that the relay contact 41 has a stuck-closed fault if electric power is supplied to the microcomputer 33. Note that whether electric power is supplied to the microcomputer 33 is determined on the basis of the terminal voltage of a connecting terminal 63 at which the microcomputer 33 is connected to the third power supply path L3. Then, when the stuck-closed fault has been detected, for example, an alarm lamp is lit up to notify the driver of the fault.

Figure 5:
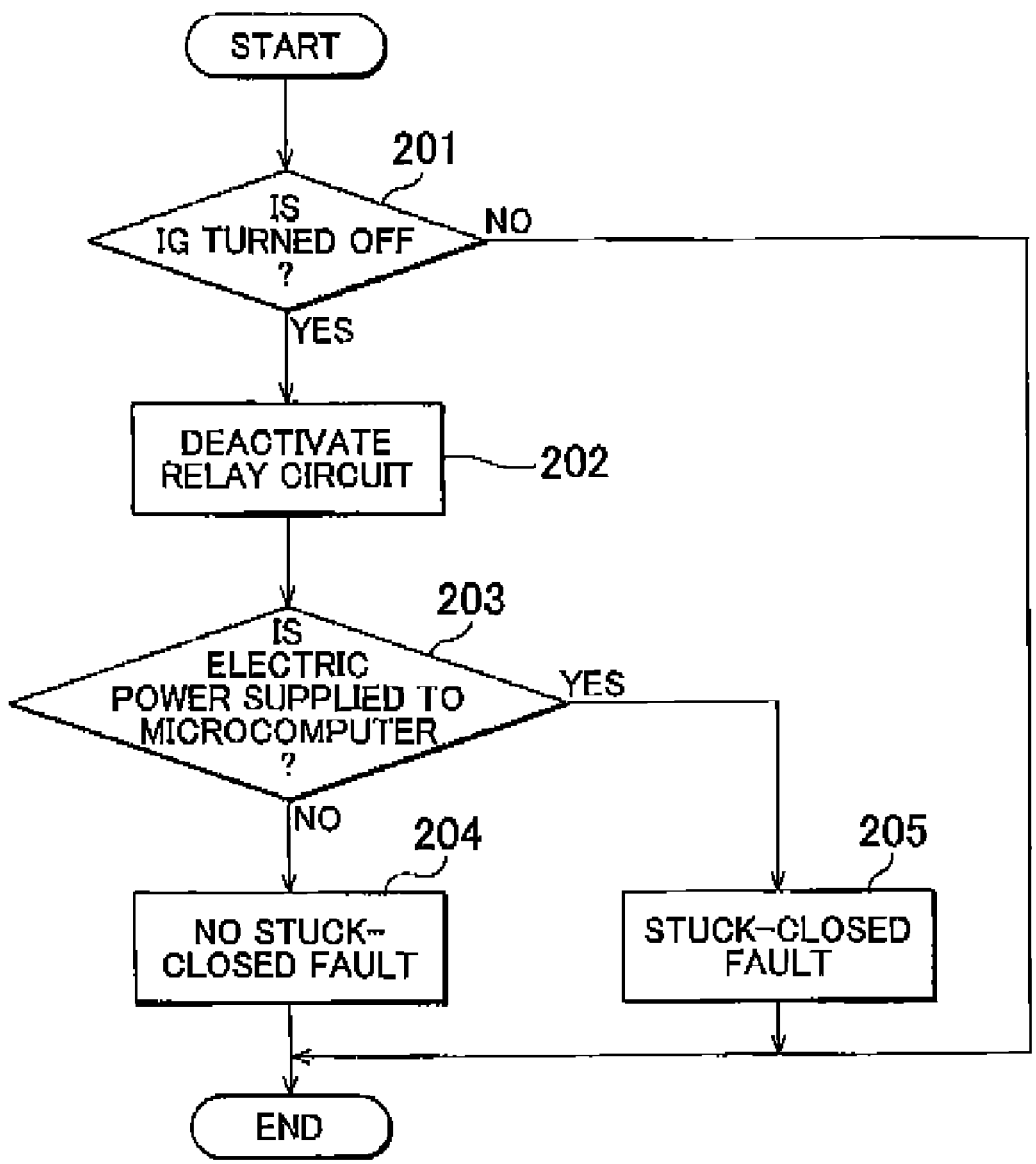
FIG. 5 is a flowchart that shows the procedure of end control.

Next, the procedure of end control executed by the ECU 23 at the time when the ignition switch 52 is turned off will be described with reference to the flowchart shown in FIG. 5. As shown in the drawing, when the ECU 23 (microcomputer 33) determines that the ignition switch 52 is turned off on the basis of the IG signal Sig (step 201: YES), the microcomputer deactivates the relay circuit 42 (step 202), and proceeds to step 203. When the microcomputer 33 determines that the ignition switch 52 is not turned off (step 201: NO), the microcomputer 33 does not execute the process in step 202 and the following steps.

In step 203, the microcomputer 33 determines whether electric power is supplied to the microcomputer 33 (step 203), and, when no electric power is supplied to the microcomputer 33 (step 203: NO), the microcomputer 33 determines that the relay contact 41 has no stuck-closed fault (step 204), and ends the process. On the other hand, when electric power is supplied to the microcomputer 33 (step 203: YES), the microcomputer 33 determines that the relay contact 41 has a stuck-closed fault (step 205), and ends the process. Note that, for the sake of convenience of description, in steps 203 and 204, the microcomputer 33 determines that the relay contact 41 has no stack-closed fault when no electric power is supplied to the microcomputer 33. However, when the relay contact 41 has no stuck-closed fault, supply of electric power to the microcomputer 33 is interrupted and then the microcomputer 33 stops. Therefore, the microcomputer 33 does not make the above determination.

As described in detail above, the present embodiment has the following advantageous effects.

1) The ECU 23 includes the driving circuit 32 that is configured as an H bridge circuit, the microcomputer 33 that controls the operation of the driving circuit 32, the capacitor 43 for stabilizing supply of electric power to the driving circuit 32 and the resistor 51 that is interposed in the second power supply path L2 that bypasses the first power supply path L1 in which the relay contact 41 is interposed. The microcomputer 33 activates the relay circuit 42 after the capacitor 43 is precharged via the resistor 51 (second power supply path L2). Then, the microcomputer 33 determines whether a stuck-open fault has occurred on the basis of the voltage difference between the terminals of the relay contact 41 at the time when both the FETs 35a and 35c that are connected in series and that constitute the driving circuit 32 are turned on to cause the discharge of the capacitor 43 after the relay circuit 42 is activated.

With the above configuration, if the relay contact 41 has a stuck-open fault, when the driving circuit 32 causes the discharge of the capacitor 43 in a state where the capacitor 43 is precharged via the resistor 51, the capacitor 43-side terminal voltage Vb of the relay contact 41 decreases with a voltage drop caused by the resistor 51, and then a voltage difference ΔV occurs between both terminals of the relay contact 41. Thus, when a voltage difference occurs between both terminals of the relay contact 41 while the capacitor 43 is being discharged, the microcomputer 33 may determine that the relay contact 41 has a stuck-open fault. In this way, when the capacitor 43 is discharged in a state where the capacitor 43 is precharged via the resistor 51, whether a stuck-open fault has occurred is determined on the basis of the voltage difference ΔV that occurs between both terminals of the relay contact 41. Therefore, the precharge circuit is not required to have a function of switching between the execution and termination of the precharge, unlike the existing art. In addition, the capacitor 43 is discharged by turning on both the FETs 35a and 35c that constitute the switching arm 36. Therefore, the discharge circuit is no longer required. Accordingly, it is possible to employ a circuit having a scale smaller than that of the precharge circuit. As a result, it is possible to reduce the number of components and reduce the area of the substrate. This makes it possible to reduce the cost and decrease the failure rate of the EPS 1.

2) The microcomputer 33 receives electric power supplied through the third power supply path L3 that is electrically connected via the resistor 51 of the second power supply path L2. Then, the microcomputer 33 determines that the relay contact 41 has a stuck-closed fault when electric power is supplied to the microcomputer 33 after the ignition switch 52 is turned off and the relay circuit 42 is deactivated. With the above configuration, when the relay contact 41 has a stuck-closed fault, electric power is supplied to the microcomputer 33 after the ignition switch 52 is turned off and the relay circuit 42 is deactivated. Thus, the microcomputer 33 may determine that the relay contact 41 has a stuck-closed fault when electric power is supplied to the microcomputer 33 after the ignition switch 52 is turned off and the relay circuit 42 is deactivated.

3) When the microcomputer 33 causes the discharge of the capacitor 43 via the switching arm 36, the microcomputer 33 limits the duty ratios of the motor control signals Sm that are input in the pair of FETs 35a and 35c at or below the predetermined duty ratio. Thus, when the capacitor 43 is discharged, it is possible to prevent excessive current from flowing from the power supply 31 to the FETs 35a and 35c. Therefore, it is possible to inhibit deterioration of the FETs 35a and 35c.

4) The microcomputer 33 determines that the relay contact 41 has a stuck-open fault when the voltage difference ΔV between both terminals of the relay contact 41 at the time when the capacitor 43 is discharged is larger than or equal to the predetermined voltage difference Vth. Thus, it is possible to prevent erroneous determination that the relay contact 41 has a stuck-open fault, when the voltage difference that is smaller than the predetermined voltage deference Vth is caused due to the influence of a noise, or the like.

Note that the above embodiment may be modified into the following alternative embodiments.

In the above embodiment, a brush direct-current motor is employed as the motor 21, and the driving circuit 32 is formed of the two switching arms 36 and 37. However, the aspect of the invention is not limited to the above embodiment. A brushless motor that is driven by three-phase driving currents may be employed as the motor 21, the driving circuit 32 may be formed of three switching arms that correspond to the respective phases and that are connected in parallel with one another, and the capacitor 43 may be discharged via only one of these three switching arms.

In the above embodiment, the microcomputer 33 determines that the relay contact 41 has a stuck-closed fault when electric power is supplied to the microcomputer 33 after the ignition switch 52 is turned off and the relay circuit 42 is deactivated. However, the aspect of the invention is not limited to this. The microcomputer 33 may determine that the relay contact 41 has a stuck-closed fault when electric power is supplied to another electrical component 57 that receives electric power supplied through the third power supply path L3 after the ignition switch 52 is turned off and the relay circuit 42 is deactivated.

In the above embodiment, the microcomputer 33 determines whether a stuck-closed fault of the relay contact 41 has occurred when the ECU 23 turns off the ignition switch 52. However, the aspect of the invention is not limited to this. The configuration where the microcomputer 33 does not determine whether a stuck-closed fault has occurred may be employed.

In the above embodiment, the IG signal Sig that indicates the on/off state of the ignition switch 52 is input from the upper level ECU to the microcomputer 33. However, the aspect of the invention is not limited to this. The IG signal Sig may be input from another element, or the like. For example, a sensor that detects driver's operation on the ignition switch may be provided, and an IG signal may be output from the sensor to the microcomputer 33.

In the above embodiment, the microcomputer 33 activates the relay circuit 42 after a lapse of the predetermined period of time after the ignition switch 52 is turned on. However, the aspect of the invention is not limited to this. The precharge amount of the capacitor 43 may be detected, and the relay circuit 42 may be activated after the precharge amount is larger than or equal to a predetermined amount at which inrush current does not flow.

In the above embodiment, in the ECU 23, the voltage sensor 61 is provided between the ignition switch 52 and the diode 56 and the voltage sensor 62 is provided between the capacitor 43-side terminal of the relay contact 41 and the coil 47. However, the aspect of the invention is not limited to this. As long as it is possible to detect both terminal voltages Va and Vb of the relay contact 41, voltage sensors may be provided at other locations.

In the above embodiment, the duty ratios of the motor control signals Sm are set at or below the predetermined ratio at which a current flowing from the power supply 31 is prohibited from being excessive. However, the aspect of the invention is not limited to this. The duty ratios need not be set at or below the predetermined duty ratio.

In the above embodiment, the invention is applied to the ECU 23 that controls the operation of the motor 21 that is the driving source of the EPS actuator 22. However, the aspect of the invention is not limited to this. The invention may be applied to an ECU that controls the operation of an actuator of a component other than the motor 21 of the EPS actuator 22.

In addition, the type of EPS is also not limited to a column assist-type; it may be of a pinion assist-type or a rack assist-type.

What is claimed is:

1. An electric power steering system comprising:
    a motor that applies assist force for assisting steering operation to a steering system;
    a driving circuit that supplies a driving current to the motor on the basis of a power supply voltage, and that is formed by connecting switching arms, each of which is formed of a pair of switching elements connected in series, in parallel with each other;
    a controller that controls operation of the driving circuit;
    a relay circuit that turns on or off a relay contact provided in a first power supply path that connects the driving circuit and a power supply to each other; and
    a fault detector that detects a fault of the relay contact, wherein
    a capacitor is interposed between the relay contact and the driving circuit,
    the relay circuit is activated after the capacitor is charged through a second power supply path that bypasses the relay contact when an ignition switch is turned on,
    the fault detector determines whether the relay contact has a stuck-open fault, in which the relay contact remains turned off, on the basis of a voltage difference between both terminals of the relay contact after the relay circuit is activated,
    a resistor is interposed in the second power supply path, and
    the controller turns on both of the switching elements that constitute one of the switching arms when whether the relay contact has the stuck-open fault is determined.

2. The electric power steering system according to claim 1, wherein:
    an electronic circuit that constitutes the fault detector receives electric power supplied through a third power supply path electrically connected to the second power supply path when the ignition switch is turned on; and
    the fault detector determines that the relay contact has a stuck-closed fault, in which the relay contact remains turned on, when electric power is supplied to the electronic circuit after the ignition switch is turned off and the relay circuit is deactivated.

3. The electric power steering system according to claim 2, wherein the fault detector determines that the relay contact has a stuck-open fault when a voltage difference between both terminals of the relay contact at the time when the capacitor is discharged via one of the switching arms is larger than or equal to a threshold after the relay circuit is activated.

4. The electric power steering system according to claim 2, wherein the controller limits a duty ratio of a pulse signal that is input as a driving signal in the pair of switching elements that constitute one of the switching arms at or below a predetermined duty ratio in order to prevent a current flowing into the pair of switching elements from being excessive when the capacitor is discharged via the one of the switching arms to determine whether the relay contact has a stuck-open fault.

5. The electric power steering system according to claim 4, wherein the fault detector determines that the relay contact has a stuck-open fault when a voltage difference between both terminals of the relay contact at the time when the capacitor is discharged via one of the switching arms is larger than or equal to a threshold after the relay circuit is activated.

6. The electric power steering system according to claim 1, wherein the controller limits a duty ratio of a pulse signal that is input as a driving signal in the pair of switching elements that constitute one of the switching arms at or below a predetermined duty ratio in order to prevent a current flowing into the pair of switching elements from being excessive when the capacitor is discharged via the one of the switching arms to determine whether the relay contact has a stuck-open fault.

7. The electric power steering system according to claim 6, wherein the fault detector determines that the relay contact has a stuck-open fault when a voltage difference between both terminals of the relay contact at the time when the capacitor is discharged via one of the switching arms is larger than or equal to a threshold after the relay circuit is activated.

8. The electric power steering system according claim 1, wherein the fault detector determines that the relay contact has a stuck-open fault when a voltage difference between both terminals of the relay contact at the time when the capacitor is discharged via one of the switching arms is larger than or equal to a threshold after the relay circuit is activated.

* * * * *